(12) United States Patent
Teggatz et al.

(10) Patent No.: US 6,215,637 B1
(45) Date of Patent: Apr. 10, 2001

(54) INTERNAL VOLTAGE CLAMP PROTECTION CIRCUIT WITHOUT PARASITIC CROSS-TALK

(75) Inventors: Ross E. Teggatz, McKinney; John H. Carpenter, Jr., Rowlett; Tohru Tanaka, Dallas; Joseph A. Devore, Richardson, all of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/290,283

(22) Filed: Apr. 13, 1999

(51) Int. Cl.$^7$ ........................................ H02H 3/22
(52) U.S. Cl. ..................... 361/111; 361/56; 361/91.5
(58) Field of Search ......................... 361/56, 91.1, 91.5, 361/111

(56) References Cited

U.S. PATENT DOCUMENTS

| | | | |
|---|---|---|---|
| 4,037,140 | * | 7/1977 | Eaton, Jr. ........................... 361/56 |
| 5,654,863 | * | 8/1997 | Davies ............................... 361/111 |
| 5,870,268 | * | 2/1999 | Lin et al. ........................... 361/111 |
| 5,963,412 | * | 10/1999 | En ..................................... 361/111 |

OTHER PUBLICATIONS

Welsher, et al., "Design for Electrostaticnic–Discharge(ESD) Protection in Telecommunications Products," *AT&T Technical Journal*, May/Jun. 1990, pp. 77–96.

L. R. Avery, "A Review of Electrostatic Discharge Mechanisms and On–Chip Protection Techniques to Ensure Device Reliabiliuty," *Journal of Electrostatics*, 24 (1990), pp. 111–130, (No Month).

Greason et al., "The Effects of Electrostatic Discharge on Microelectronic Devices—A Review," *IEEE Transactions on Industry Applications*, vol. IA–20, No. 2, Mar./Apr. 1984, pp. 247–252.

Duvvury et al., "ESD: A Pervasive Reliability Concern for IC Technologies," *Proceedings of the IEEE*, vol. 81, No. 5, May 1993, pp. 690–702.

Rountree et al., "NMOS Protection Circuitry," *IEEE Transactions on Electron Devices*, vol. Ed–32, No. 5, May 1985, pp 910–917.

\* cited by examiner

*Primary Examiner*—Michael J. Sherry
(74) *Attorney, Agent, or Firm*—Wade James Brady, III; Frederick J. Telecky, Jr.

(57) ABSTRACT

A internal circuitry protection scheme which protects on-IC circuitry when an external pin is shorted to a higher than normal voltage. The disclosed solution eliminates cross-talk due to a parasitic NPN.

12 Claims, 4 Drawing Sheets

INTERNAL VOLTAGE CLAMP PROTECTION CIRCUIT WITHOUT PARASITIC CROSS-TALK

BACKGROUND AND SUMMARY OF THE INVENTION

The present invention relates to integrated circuit protection circuits.

Background: ESD Protection

In MOS integrated circuits, the inputs are normally connected to drive the gate of one or more MOS transistors. (The term "MOS" is used in this application, as is now conventional, to refer to any insulated-gate-field-effect-transistor (IGFET), or to integrated circuits which include such transistors.) A longstanding problem is that electrostatic discharges (or similar externally generated voltage transients) may break down the thin gate oxide. Once the gate oxide has thus been punctured, the transistor may be permanently damaged. Thus, it has long been conventional to use protection devices on the input pins of MOS integrated circuits. Such protection devices are designed to avalanche (passing a large amount of current, and dissipating the energy of the incoming transient) before the voltage on the input pin can reach levels which would damage the gate oxide.

However, technological advances are leading to the creation of components that are increasingly smaller and faster but also more fragile. The output stages of MOS circuit which, until now, have been capable of standing up to high discharge currents, are becoming vulnerable. In particular, the advantages of the various techniques for improving the performance characteristics of integrated circuits, such as techniques for the thinning of the gate oxide layers, the reduction of the width of the conduction channels of the transistor or, again, the very low doping and small thickness of the drain regions of the transistors are offset by increased sensitivity to over-voltages or discharges, because the breakdown voltages of the junctions or punch-through voltages between drain and source of the MOS transistors become lower, and because the gate oxide is more fragile. (Flow of large currents may lead to generation of hot carriers, which can become trapped in the gate oxide and produce a long-term shift in the characteristics of the device.)

A variety of device structures for protecting integrated circuits against electrostatic discharge have been proposed. See, e.g., the following articles, and references cited therein, all of which are incorporated by reference: Duvvury et al., "ESD: a pervasive reliability concern for IC technologies," 81 Proc. IEEE 690 (1993); Amerasekera et al., "ESD in integrated circuits," 8 Quality and Reliability Engineering International 259 (1992); Welsher et al., "Design for electrostatic-discharge (ESD) protection in telecommunications products," 69 AT&T Technical Journal 77 (1990); Avery, "A review of electrostatic discharge mechanisms and on-chip protection techniques to ensure device reliability," 24 J. Electrostatics 111 (1990); Greason et al., "The effects of electrostatic discharge on microelectronic devices-a review," 20 IEEE Transactions on Industry Applications 247 (1984); R. N. Rountree and C. L. Hutchins, "NMOS protection circuitry," *IEEE Trans. Electron Devices,* vol. ED-32, pp. 910–917, May 1985; the entire annual proceedings of the International Reliability Physics Symposia ("IRPS") for years 1980 to date; and the entire annual proceedings of the EOS/ESD symposia for years 1979 to date.

Overvoltage Protection

A similar problem arises in systems using multiple voltage levels. For example, an automotive system may use a system/battery power source which is nominally ~14V (and may, for a short time, go as high as ~40V), but have internal components which must be protected from overvoltage, particularly with regard to limiting the voltage applied to the gate oxide to 10–20V. In these cases, there is a risk not only of typical ESD, but that any external pin of the regulated lower-voltage system will be inadvertently shorted to the higher voltage. If this occurs, there is a significant risk of damage to the low-voltage oxide. To prevent this, it is preferable that an overvoltage protection circuit be integrated into the low-voltage system.

One way to protect internal circuitry from the application of a higher-than-normal voltage is the use of a voltage clamp, which limits the voltage passed on to the internal circuitry. This, in turn, reduces or eliminates the chance of damaging the on-die circuitry. Unfortunately, current voltage clamp circuits, which comprise a zener diode configuration, will create a parasitic device when coupled with a driver circuit.

Background: Device Isolation

One of the major problems with integrated power devices is device isolation. In particular, the voltage magnitudes and current transient which can occur with power device operation present isolation difficulties far beyond those encountered in normal small-signal integrated circuits. For this reason some smart power integrated circuits use full dielectric isolation, in which the diffusion of the power device are completely separated from the small-signal devices, i.e., there is no path through semiconductor materials to connect the two. Alternatively, only one terminal of the power device may be connected to the small-signal devices. However, this requires a much more expensive and cumbersome fabrication process.

Background: Parasitic Cross-Talk in Current Circuits

FIG. 5 shows the general context of these protection circuits: in each case a gate drive signal (G1 or G2) is used to control a low-side-driver output NMOS, to drive an output pin DRN1 or DRN2. In such circuits some clamping is needed between node B (the gate connection) and node C (ground) to protect the gate oxide.

Two common prior art circuits are shown in FIGS. 6A and 6B, which show typical zener voltage clamps. FIG. 6A shows a first sample prior art configuration, in which a string of base/collector-to-emitter diodes is connected between the gate drive terminal and ground. A series resistor R1 provides current limit protection between the external node and the gate drive node. FIG. 6B shows a somewhat similar configuration, except that in this case the diodes used are base-to-collector/emitter connected rather than emitter-connected bipolar transistor structures.

Both of these structures have their difficulties, as shown in FIGS. 7A and 7B, which show a sample context in which the circuits of FIGS. 6A and 6B might be used. In each diode string, at least one pair of the diodes is back to back, so that conduction will not occur unless the clamp voltage is exceeded. The voltage is clamped using the using the forward voltage drop of the BC-to-E (in FIG. 7A) or Vbe (in FIG. 7B) of Q1, or the reverse breakdown voltage of the BC-to-E (in FIG. 7A) or the Veb (in FIG. 7B) of Q2 and Q3.

One common problem in using these standard zener claims is that a parasitic device is formed in a standard N-EPI on P-substrate (or, P-EPI on N-substrate, or any junction-isolated process). In these configurations, a parasitic transistor Q11 will exist between the NMOS drain diffusion of the output drive transistor and the collector diffusion of the diode-connected transistors; this parasitic transistor is most significant in terms of cross-talk on the transistor in the string of diode-transistors which is closest to the gate, Q1 in this example. The parasitic device is an NPN transistor which is formed by the drain NTANK (emitter) of the NMOS and the collector NTANK (collector) of the zener, and the substrate forms the base P region, as shown in FIG. 7A.

This parasitic NPN will turn on when one drain of a NMOS is negative and the gate node with the clamp is positive. This can cause significant cross-talk, meaning the voltage on the gate could be pulled low, switching the device off, which could then lead to operational problems. This transistor can be avoided by using a double epitaxial process or by using full dielectric isolation, but of course these technologies are very expensive and are not available in standard integrated circuit processes.

FIG. 7B similarly shows the parasitic device in combination with the protection structure of FIG. 6B, where B-to-CE connected diodes are used. Hereto, the collector diffusion of the top diode/transistor protection device (Q4 in this case) forms the collector of a parasitic NPN transistor Q11. This leads to problems as discussed above. The base of this parasitic NPN transistor will be the P-type substrate. This transistor will not have very high gain, but nevertheless can be troublesome and can affect the operation of other NMOS devices.

In prior art circuits such as that shown in FIG. 7A, parasitic device Q11 can pull the gate voltage down to with a VCE of the NMOS's drain. In circuits as in FIG. 7B, parasitic device Q11 can pull the gate voltage down to with a VBE of the NMOS's drain. Note that FIGS. 7A and 7B also show the external load in a worst-case situation, where the external load is an inductance L_load. Such loads are common where the circuit is being used for motor drive, for example.

In these two cases, the parasitic can be minimized by inserting a guard ring around the zener devices. This would increase die area 15–20% and would not guarantee that under all conditions that cross-talk would not happen.

Innovative Voltage Clamp Protection Circuit

The present application discloses an internal circuitry protection scheme which protects on-IC circuitry when an external pin is shorted to a higher than normal voltage. The disclosed solution eliminates cross-talk due to a parasitic NPN.

Advantages of the disclosed methods and structures include:

Reduced die area vs. prior solutions (Guard Rings)

Flexible for circuit adjustment

Improved current sharing

The preferred embodiment has many advantageous applications, including but not limited to power NMOS circuits for automotive, industrial, and other low-side drive applications which have negative transients. Specific examples include unipolar motors, control solenoids, and actuator solenoids.

BRIEF DESCRIPTION OF THE DRAWINGS

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

The preferred embodiment provides an IC protection circuit which eliminates parasitic cross-talk. When providing an external pin, there is a chance that pin could inadvertently be taken to a higher voltage than the normal voltage. This clamping circuit limits the voltage passed on to the internal circuitry, eliminating the chance of damaging the on die circuitry.

Figure 5:
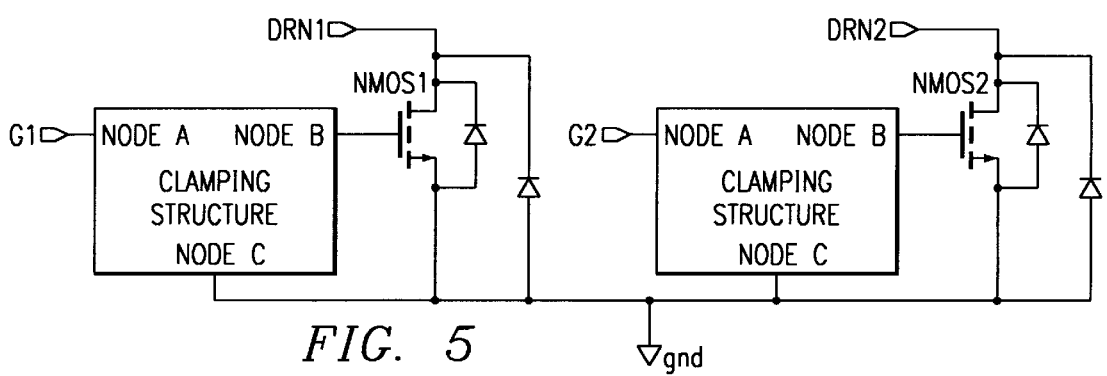
FIG. 5 shows the general context of the present and prior-art circuits.

On power arrays used in low-side FET drives there are separate NMOS drains and gates but the source and substrate are tied to ground, as shown in FIG. 5. When driving some types of loads, one NMOS could be turning on while another is turning off, which with certain applications can create a negative voltage transient when the NMOS is switched off. The turning-off NMOS drain going negative could turn on a parasitic pulling the turning-on NMOS gate down, preventing proper operation. This condition could happen when driving mutually coupled inductive loads, such as in a unipolar motor application.

Figure 1A:
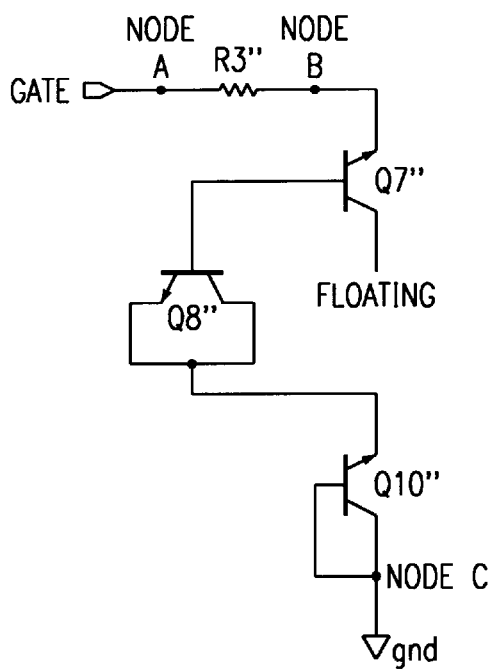
FIG. 1A shows the preferred embodiment of the present invention.
Figure 2:
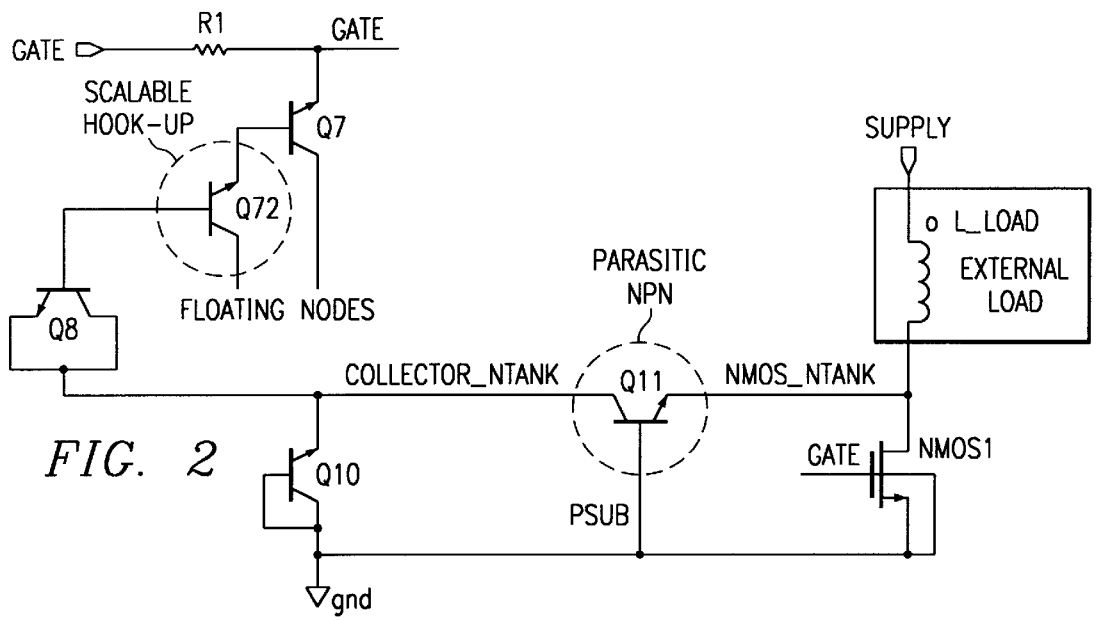
FIG. 2 shows the preferred embodiment of FIG. 1A in the context of a low-side driver circuit without cross-talk.
Figure 3:
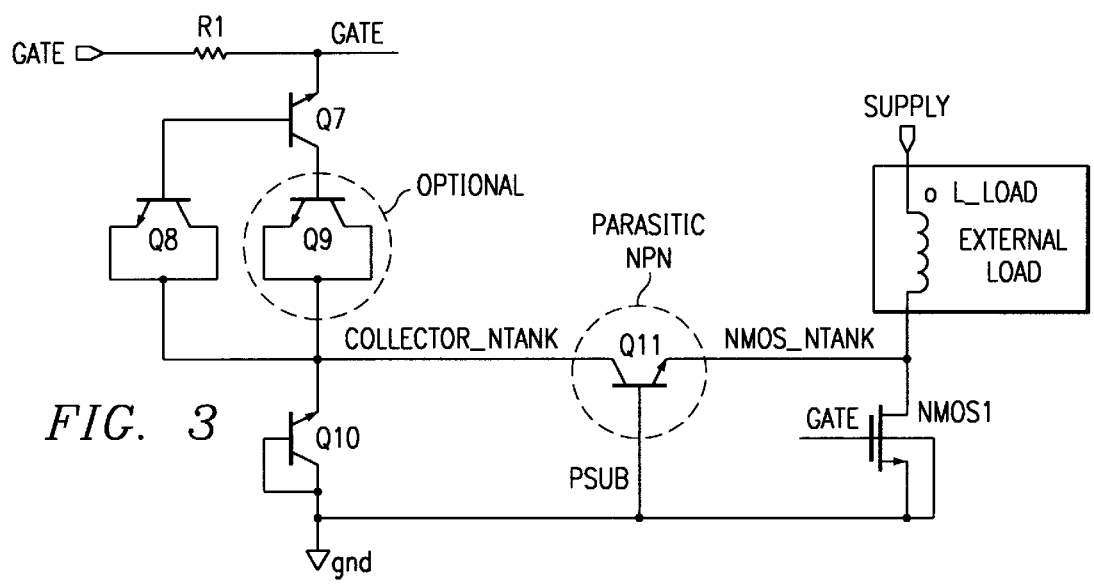
FIG. 3 shows the second embodiment of FIG. 1C in the context of a low-side driver circuit without cross-talk.

By connecting up voltage clamp as shown in FIG. 1A to the driver network as shown in FIG. 2, the parasitic device can be moved and eliminate the chance for cross-talk. Using a clamp as shown in FIG. 2, the parasitic device Q11 cannot pull the gate down because it would have to turn on the zener (Q7's Veb and Q8's Vbe, and Q72's Veb if the scaleable option is utilized). That is, while a parasitic device still forms, the collector of the parasitic Q11 isolated from the GATE' connection of NMOS1.

Note that the GATE node on either end of R1 is used for turning on the circuit, and the GATE' node on the NMOS1 is used for turning off the circuit. These are not the same nodes.

Figure 7A:
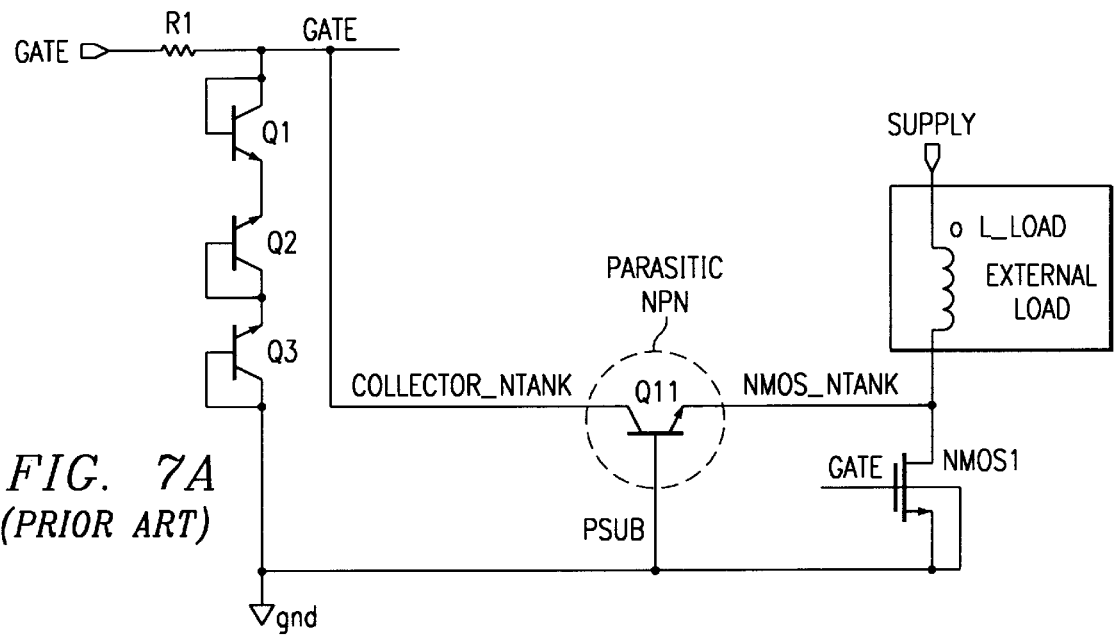
FIGS. 7A and 7B show prior art driver circuits which use the circuits shown in FIGS. 6A and 6B respectively.
Figure 7B:
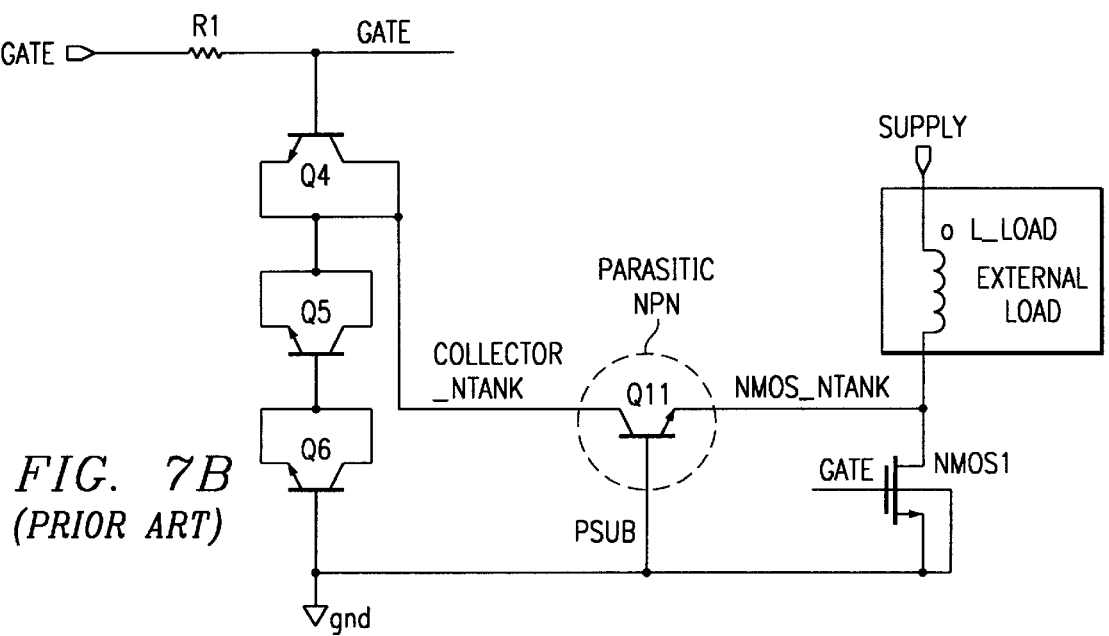

Therefore, to turn on the parasitic Q11, the emitter must be 0.7V below the base (which is the P substrate, 0V). In order for the Q11 collector to go and affect GATE the Q7 Veb, Q72 Veb, and Q8 Vbe must be exceeded. Note that Veb=~9V, and Vbe=~0.7V. This is a significant advantage over the circuit of FIG. 7A, in which it takes only the Q11 emitter to go 0.7V below the gate of Q11 to affect the GATE node.

Since the negative-transient is known and this clamp is scaleable, as shown by optional transistor Q72 in FIG. 2, so an appropriate number of transistors may be linked to ensure that the negative transient from the switching transistors is incapable of turning on the zener. In this way, the cross-talk is eliminated.

The embodiment of FIG. 1A and its sample context of FIG. 2 use floating collectors. This particular embodiment is sufficient to eliminate cross-talk due to a positive transient of up to three Veb's plus a diode (Vbe), or a negative transient of up to two Veb's plus a diode (Vbe). Thus, this embodiment presents a significant advantage over known voltage clamps, while requiring only the same number of elements.

Note that there is a parasitic just like Q11 on the collector of Q7, however since Q7 is not turned on the negative voltage would have to exceed the Vce breakdown voltage to pull down on the GATE. Further, these innovative embodiments do not require the sacrificial collector type guard ring that is normally the standard solution to this problem.

Figure 1B:
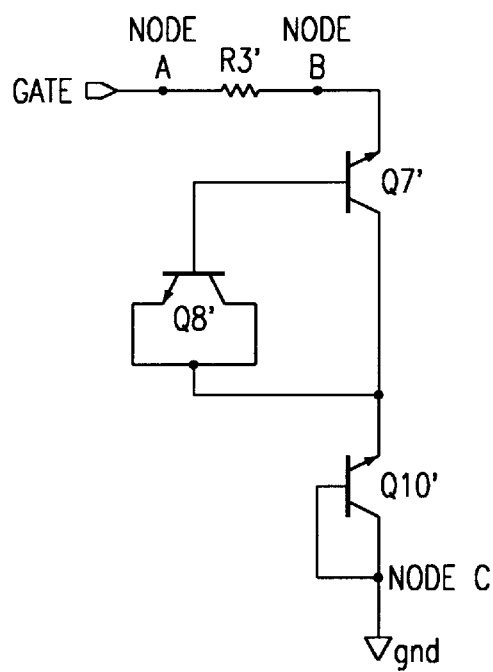
FIG. 1B shows a second embodiment of the present invention.

Alternate Embodiment: FIG. 1B

In an alternative embodiment, as shown in FIG. 1B, the collectors of transistor Q7 is connected to the emitter of transistor Q8. This connection provides a second current path, so that when Q7 turns on, it can handle more current than the circuit of FIG. 1A. This solution also only requires the same number of elements as in the prior art, and is sufficient to eliminate cross-talk due to a positive transient of up to three Veb's plus a diode (Vbe), or a negative transient of up to two Veb's plus a diode (Vbe). This circuit is also scaleable.

Figure 1C:
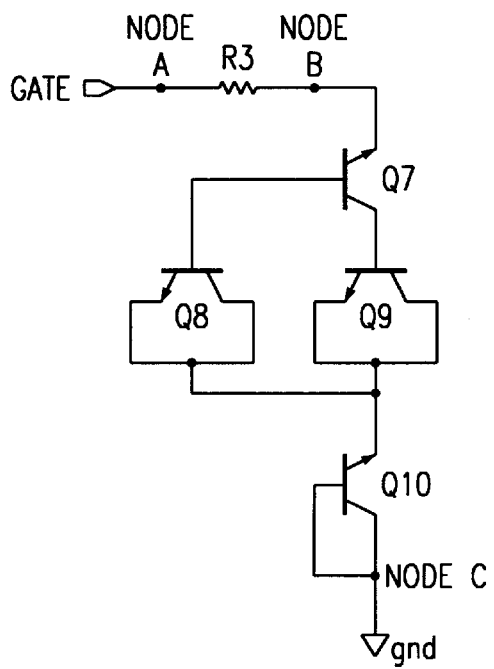
FIG. 1C shows a third embodiment of the present invention.

Alternate Embodiment: FIG. 1C

Figure 4:
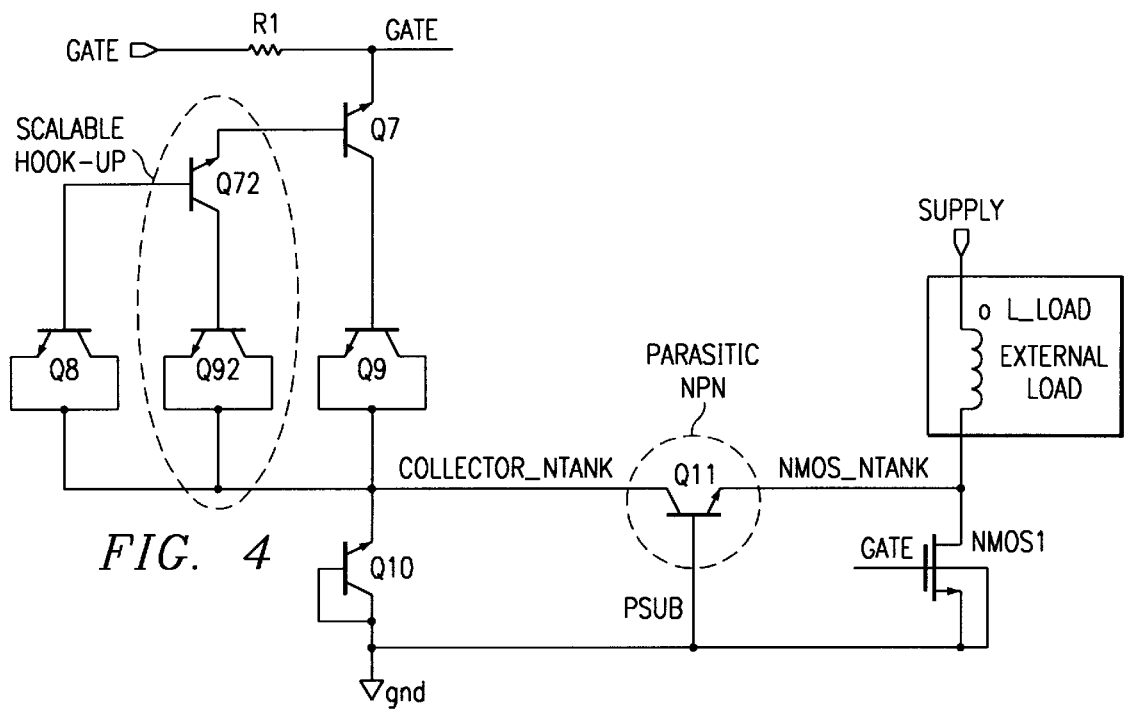
FIG. 4 shows the second embodiment of FIG. 1C in the context of a low-side driver circuit without cross-talk, scaled to accommodate a greater negative voltage.
Figure 6A:
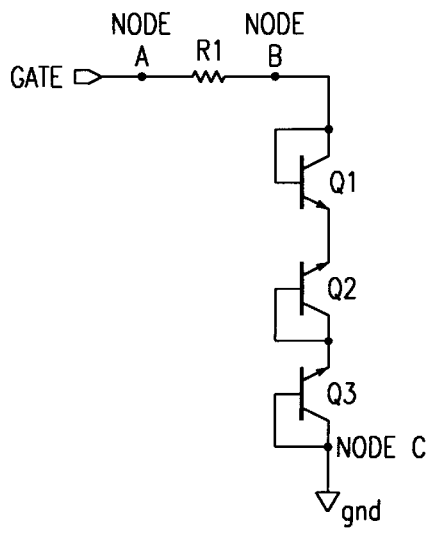
FIGS. 6A and 6B show prior art voltage clamps with parasitic cross-talk.
Figure 6B:
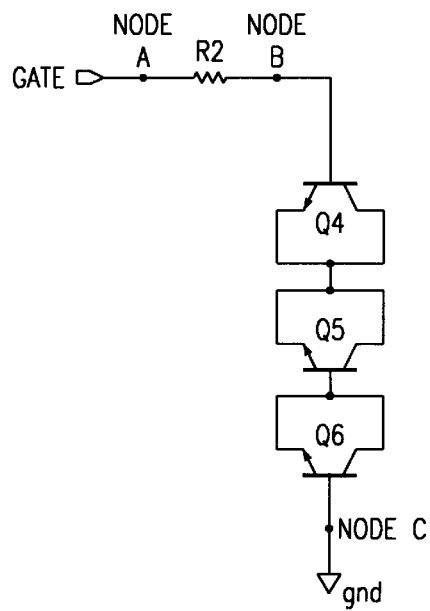

An alternate embodiment, as shown in FIG. 1C, requires an additional device in the form of transistor Q9, connected in parallel with Q8. This embodiment also eliminates the cross-talk created by the parasitic turning on, and is scaleable to meet typical negative voltage transients, as shown by optional transistors Q72 and Q92 in FIG. 4. A particular advantage of this embodiment is that in the case of an ESD strike, the additional transistor Q9, as shown in FIGS. 1C and 4, turns on and shares the current load through its lateral PNP, thus improving device survivability by dividing the current passing through the substrate.

The embodiment of FIG. 1C eliminates parasitic cross-talk for positive transients of up to two Veb's plus a diode (Vbe), or a negative transient of up to one Veb plus a diode (Vbe).

According to a disclosed class of innovative embodiments, there is provided a integrated circuit smart power transistor driver circuit, comprising a stack of one or more clamp diodes operatively connected with a first polarity between a gate drive line and a power connection; one or more second diodes connected with a second polarity, in series with said stack of first diodes, between said gate drive line and said power supply connections; and a single third diode, connected with said second polarity between said stack of first diodes and said power supply connection; wherein said second diodes define a parasitic lateral bipolar transistor, having a substrate diffusion as base thereof, and said third diode clamps the voltage of a current-carrying terminal of said parasitic lateral transistor to within one diode drop of said power supply connection.

According to another disclosed class of innovative embodiments, there is provided an integrated power driver circuit, comprising a power transistor having a carrying terminals thereof connected to first and second power connections; and a stack of one or more clamp diodes operatively connected with a first polarity between a gate drive line and said second power connection; one or more second diodes connected with a second polarity, in series with said stack of first diodes, between said gate drive line and said power supply connections; and a single third diode, connected with said second polarity between said stack of first diodes and said second power supply connection; wherein said second diodes define a parasitic lateral bipolar transistor, having a substrate diffusion as base thereof, and said third diode clamps the voltage of a current-carrying terminal of said parasitic lateral transistor to within one diode drop of said second power supply connection.

According to another disclosed class of innovative embodiments, there is provided an integrated power driver circuit, comprising a power transistor having a first and second current carrying terminal thereof respectively connected to first and second power supply connections; and a stack of diodes connected in series between a gate drive line and said power supply terminal, said stack of diodes including at least two back to back diode connection; wherein a parasitic lateral bipolar transistor is defined having a substrate diffusion as a base, a first current carrying terminal connected to said stack of diodes, and a second current carrying terminal connected to said first current carrying terminal of said power transistor.

Modifications and Variations

As will be recognized by those skilled in the art, the innovative concepts described in the present application can be modified and varied over a tremendous range of applications, and accordingly the scope of patented subject matter is not limited by any of the specific exemplary teachings given, but is only defined by the issued claims.

What is claimed is:

1. An integrated circuit smart power transistor driver circuit, comprising:
   a stack of one or more clamp diodes operatively connected with a first polarity between a gate drive line and a power connection;
   one or more second diodes connected with a second polarity, in series with said stack of first diodes, between said gate drive line and said power supply connections; and
   a single third diode, connected with said second polarity between said stack of first diodes and said power supply connection;
   wherein said second diodes define a parasitic lateral bipolar transistor, having a substrate diffusion as base thereof, and said third diode clamps the voltage of a current-carrying terminal of said parasitic lateral transistor to within one diode drop of said power supply connection.

2. The integrated circuit of claim 1, wherein said power transistor is a MOSFET.

3. The integrated circuit of claim 1, wherein said power transistor is not separated from said diode stack by a dielectric isolation.

4. The integrated circuit of claim 1, wherein said diodes are diode-connected NPN transistors.

5. An integrated power driver circuit, comprising:
   a power transistor having a carrying terminals thereof connected to first and second power connections; and a stack of one or more clamp diodes operatively connected with a first polarity between a gate drive line and said second power connection;

one or more second diodes connected with a second polarity, in series with said stack of first diodes, between said gate drive line and said power supply connections; and a single third diode, connected with said second polarity between said stack of first diodes and said second power supply connection;

wherein said second diodes define a parasitic lateral bipolar transistor, having a substrate diffusion as base thereof, and said third diode clamps the voltage of a current-carrying terminal of said parasitic lateral transistor to within one diode drop of said second power supply connection.

6. The integrated circuit of claim 5, wherein said power transistor is a MOSFET.

7. The integrated circuit of claim 5, wherein said power transistor is not separated from said diode stack by a dielectric isolation.

8. The integrated circuit of claim 5, wherein said diodes are diode-connected NPN transistors.

9. An integrated power driver circuit, comprising:

a power transistor having a first and second current carrying terminal thereof respectively connected to first and second power supply connections; and a stack of diodes connected in series between a gate drive line and said power supply terminal, said stack of diodes including at least two back to back diode connections;

wherein a parasitic lateral bipolar transistor is defined having a substrate diffusion as a base, a first current carrying terminal connected to said stack of diodes, and a second current carrying terminal connected to said first current carrying terminal of said power transistor.

10. The integrated circuit of claim 2, wherein said power transistor is a MOSFET.

11. The integrated circuit of claim 2, wherein said power transistor is not separated from said diode stack by a dielectric isolation.

12. The integrated circuit of claim 2, wherein said diodes are diode-connected NPN transistors.

* * * * *

UNITED STATES PATENT AND TRADEMARK OFFICE
CERTIFICATE OF CORRECTION

PATENT NO. : 6,215,637 B1
DATED : April 10, 2001
INVENTOR(S) : Ross E. Teggatz, John H. Carpenter Jr., Tohru Tanaka, Joseph A. Devore, It is certified that error appears in the above-identified patent and that said Letters Patent is hereby corrected as shown below:

Title page,
Under "Filed: April 13 1999" insert: -- Related U.S. Application Data Provisional application No. 60/081,728, April 14, 1998 --.

Column 1,
After line 3, insert: -- This application claims priority under 35 USC 119(e)(1) of the provisional application number 60/081,728, filed April 14, 1998. --

Signed and Sealed this

Sixth Day of November, 2001

Attest:

Nicholas P. Godici

Attesting Officer

NICHOLAS P. GODICI
Acting Director of the United States Patent and Trademark Office